(12) United States Patent
Lee et al.

(10) Patent No.: US 8,083,962 B2
(45) Date of Patent: Dec. 27, 2011

(54) METHOD FOR FORMING MINUTE PATTERN AND METHOD FOR FORMING SEMICONDUCTOR MEMORY DEVICE USING THE SAME

(75) Inventors: Jang-Eun Lee, Suwon-si (KR); Kyung-Tae Nam, Suwon-si (KR); Se-Chung Oh, Suwon-si (KR); Jun-Ho Jeong, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 801 days.

(21) Appl. No.: 11/783,015

(22) Filed: Apr. 5, 2007

(65) Prior Publication Data

US 2007/0238031 A1    Oct. 11, 2007

(30) Foreign Application Priority Data

Apr. 6, 2006  (KR) .................. 10-2006-0031480

(51) Int. Cl.
 *B44C 1/22* (2006.01)
 *H01B 13/00* (2006.01)
 *C03C 25/68* (2006.01)

(52) U.S. Cl. ............... 216/66; 216/17; 216/22; 216/37; 216/41; 216/95; 216/99; 438/3

(58) Field of Classification Search .......... 216/17, 216/22, 37, 41, 95, 99, 66; 430/5; 438/3
See application file for complete search history.

(56) References Cited

U.S. PATENT DOCUMENTS

| | | | |
|---|---|---|---|
| 4,634,645 A | 1/1987 | Matsuda et al. | |
| 5,567,333 A * | 10/1996 | Hira et al. | 216/22 |
| 6,030,876 A * | 2/2000 | Koike | 438/303 |
| 6,265,306 B1 * | 7/2001 | Starnes et al. | 438/632 |
| 6,376,350 B1 * | 4/2002 | Duane et al. | 438/592 |
| 6,791,137 B2 * | 9/2004 | Yamada et al. | 257/298 |
| 6,861,314 B2 * | 3/2005 | Hosotani | 438/257 |
| 6,933,527 B2 * | 8/2005 | Isobe et al. | 257/59 |
| 7,001,783 B2 * | 2/2006 | Costrini et al. | 438/3 |
| 7,067,866 B2 * | 6/2006 | Shi | 257/296 |
| 7,202,535 B2 * | 4/2007 | Goldbach et al. | 257/369 |
| 7,535,036 B2 * | 5/2009 | Watanobe et al. | 257/208 |
| 7,560,755 B2 * | 7/2009 | Kapoor | 257/256 |
| 2003/0193053 A1 * | 10/2003 | Gilton | 257/72 |
| 2003/0234449 A1 * | 12/2003 | Aratani et al. | 257/758 |
| 2004/0102041 A1 | 5/2004 | Okudaira | |
| 2004/0264239 A1 * | 12/2004 | Tsang | 365/158 |
| 2005/0077580 A1 * | 4/2005 | Kumazaki | 257/390 |
| 2006/0040485 A1 * | 2/2006 | Lee et al. | 438/597 |
| 2006/0076315 A1 * | 4/2006 | Kofuji | 216/59 |
| 2007/0235322 A1 * | 10/2007 | Wu et al. | 204/192.34 |

FOREIGN PATENT DOCUMENTS

| | | |
|---|---|---|
| JP | 10-032190 | 2/1998 |
| JP | 2004-179226 | 6/2004 |
| KR | 10-2001-0036044 | 5/2001 |
| KR | 10-2002-0014228 | 2/2002 |
| KR | 10-2004-0045297 | 6/2004 |
| KR | 10-2005-0002417 | 1/2005 |

* cited by examiner

*Primary Examiner* — Nadine G Norton
*Assistant Examiner* — Christopher Remavege
(74) *Attorney, Agent, or Firm* — Lee & Morse, P.C.

(57) ABSTRACT

A method for forming a minute pattern includes depositing a material layer on a semiconductor substrate having a conductive region, forming a first mask layer on the material layer, forming a recess region in the first mask layer, performing layer processing to form a first mask pattern in the recess region, and etching the material layer to form a material layer pattern.

33 Claims, 10 Drawing Sheets

16nm      34nm      56nm

METHOD FOR FORMING MINUTE PATTERN AND METHOD FOR FORMING SEMICONDUCTOR MEMORY DEVICE USING THE SAME

BACKGROUND OF THE INVENTION

1. Field of the Invention

The present invention relates to methods for forming a minute pattern and a semiconductor memory device using the same. In particular, the present invention relates to an improved method for forming a minute island-type pattern on a semiconductor substrate.

2. Description of the Related Art

In general, manufacturing of semiconductor devices may include a series of processes, e.g., a layer forming process, a photolithography process, an etching process, a planarization process, and so forth, to facilitate formation of patterns, e.g., an island-type pattern, on a semiconductor substrate.

A conventional island-type pattern on a semiconductor substrate may be formed as follows. First, a lower electrode layer may be deposited on a semiconductor substrate followed by sequential application of first and second mask layers thereon. A photoresist pattern may be formed in a center of an upper surface of the second mask layer. Next, the photoresist pattern may be used as an etch mask to remove peripheral portions of the second mask layer, thereby forming a pattern in the second mask layer. Similarly, the patterned second mask layer may be used as an etch mask to remove peripheral portions of the first mask layer, thereby forming a pattern in the first mask layer. The first and second patterned mask layers may have identical widths, thereby forming a uniform etch mask for etching an island-type pattern in the electrode layer. Alternatively, due to a relative large width of the island-type pattern formed in the electrode layer, only one mask layer may be used for etching.

If an island-type pattern is to be formed in an electrode layer of a highly integrated semiconductor, a relative low width, i.e., about 100 nm or less, would be desired, which would require formation of etch masks having similarly low widths. However, formation of a photoresist pattern with a width of about 100 nm or less may be difficult, e.g., due to limited resolution of the exposure equipment. Even if formation of a photoresist pattern having a width of about 100 nm or less is potentially attempted, the photoresist pattern may be easily separated during the etching process, thereby generating a non-uniform island type pattern on the semiconductor substrate.

Accordingly, there exists a need for an improved method of manufacturing a minute pattern with a relatively low width in a semiconductor device.

SUMMARY OF THE INVENTION

The present invention is therefore directed to a method of forming a minute pattern in a semiconductor and a semiconductor memory device using the same, which substantially overcome one or more of the problems due to the limitations and disadvantages of the related art.

It is therefore a feature of an embodiment of the present invention to provide an improved method of forming a minute island-type pattern.

It is another feature of an embodiment of the present invention to provide a method for forming a highly integrated semiconductor memory device having a minute pattern.

At least one of the above and other features of the present invention may be realized by providing a method for forming a minute pattern including depositing a material layer on a semiconductor substrate having a conductive region, forming a first mask layer on the material layer, forming a recess region in the first mask layer, performing layer processing to form a first mask pattern in the recess region, and etching the material layer to form a material layer pattern.

Forming the recess region may include forming a photoresist pattern with an intaglio pattern on the first mask layer, etching the first mask layer, and removing the photoresist pattern. Forming the recess region in the first mask layer may include etching an upper portion of the first mask layer.

Performing layer processing may include alternating at least one formation of a layer of a second mask layer and at least one etching of the second mask layer to form a first sub-layer. For example, performing layer processing may include forming at least two sub-layers.

The etching of the layer processing may include using an ion beam. Using the ion beam may include adjusting an ion beam apparatus at an incidence angle larger than 0°. Adjusting the ion beam apparatus may include continuous adjusting of the incidence angle. Using the ion beam may include rotating the semiconductor substrate.

Formation of each layer of the second mask layer during the layer processing may include layer formation at an increasing deposition rate. Alternatively, etching of each layer of the second mask layer may include layer etching at an increasing etching rate. In yet another alternative, performing layer processing may include constant deposition and etching rates.

Forming the first mask layer may include employing a material having an etch selectivity with respect to a material used to form the first mask pattern. The material having an etch selectivity with respect to a material used to form the first mask pattern may include titanium (Ti), titanium nitride (TiN), tantalum (Ta), or tantalum nitride (TaN), and forming the first mask pattern of ruthenium (Ru), iridium (Ir), osmium (Os), palladium (Pd), platinum (Pt), copper (Cu), nickel iron (NiFe), aluminum oxide ($Al_2O_3$), silicon nitride (SiN), or silicon oxide ($SiO_2$).

Depositing the material layer may include depositing a material having an etch selectivity with respect to a material of the first mask layer. Etching the material layer may include etching a lower portion of the first mask layer to form a second mask pattern under the first mask pattern.

In another aspect of the invention, there is provided a method for forming a semiconductor memory device, including forming an interlayer insulating with a conductive plug on a semiconductor substrate, forming a data storage layer on the interlayer insulating layer, forming a first mask layer on the data storage layer, forming a recess region in the first mask layer, performing layer processing to form a first mask pattern in the recess region, and etching the material layer to form a data storage layer pattern.

Forming the data storage layer may include forming a resist layer. Forming the resist layer may include forming an antiferromagnetic layer, a ferromagnetic layer, an insulating layer, and a ferromagnetic layer. Forming the resist layer may include forming a phase change material layer or a transition metal oxide layer. Forming the data storage layer may include forming a ferroelectric layer.

Forming the recess region may include forming a photoresist pattern with an intaglio pattern on the first mask layer, etching the first mask layer, and removing the photoresist pattern. Forming the recess region in the first mask layer may include etching an upper portion of the first mask layer.

Performing layer processing may include alternating at least one formation of a layer of a second mask layer and at least one etching of the second mask layer to form a first sub-layer. For example, performing layer processing may include forming at least two sub-layers.

The etching of the layer processing may include using an ion beam. Using the ion beam may include adjusting an ion beam apparatus at an incidence angle larger than 0°. Adjusting the ion beam apparatus may include continuous adjusting of the incidence angle. Using the ion beam may include rotating the semiconductor substrate.

Formation of each layer of the second mask layer during the layer processing may include layer formation at an increasing deposition rate. Alternatively, etching of each layer of the second mask layer may include layer etching at an increasing etching rate. In yet another alternative, performing layer processing may include constant deposition and etching rates.

Forming the first mask layer may include employing a material having an etch selectivity with respect to a material used to form the first mask pattern. The material having an etch selectivity with respect to a material used to form the first mask pattern may include titanium (Ti), titanium nitride (TiN), tantalum (Ta), or tantalum nitride (TaN), and forming the first mask pattern of ruthenium (Ru), iridium (Ir), osmium (Os), palladium (Pd), platinum (Pt), copper (Cu), nickel iron (NiFe), aluminum oxide ($Al_2O_3$), silicon nitride (SiN), or silicon oxide ($SiO_2$).

Depositing the data storage layer may include depositing a material having an etch selectivity with respect to a material of the first mask layer. Etching the data storage layer may include etching a lower portion of the first mask layer to form a second mask pattern under the first mask pattern. The conductive plug may include a lower electrode, and the first and second mask patterns may include an upper electrode.

BRIEF DESCRIPTION OF THE FIGURES

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
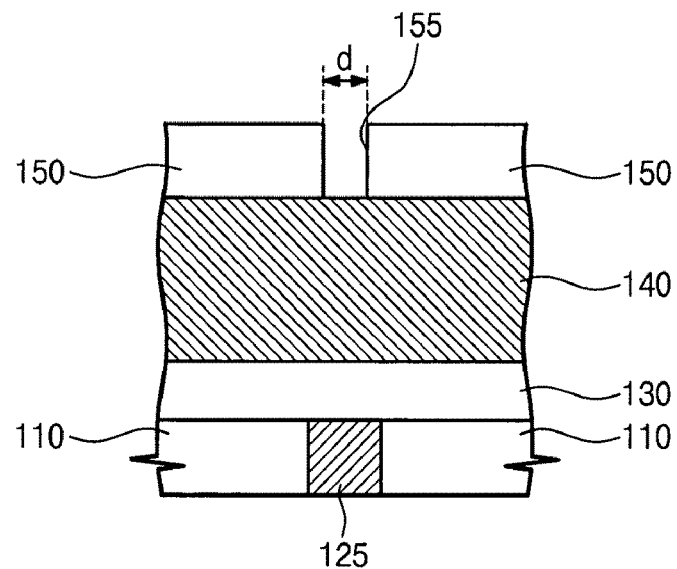
FIGS. 1-8 illustrate cross-sectional views of sequential steps during formation of a minute pattern in a semiconductor according to an embodiment of the present invention.

Korean Patent Application No. 2006-31480, filed on Apr. 6, 2006, in the Korean Intellectual Property Office, and entitled: "Method for Forming Minute Pattern and Method for Forming Semiconductor Memory Device Using the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, or one or more intervening layers may also be present. In addition, it will also be understood that when a layer is referred to as being "between" two layers, it can be the only layer between the two layers, or one or more intervening layers may also be present. Like reference numerals refer to like elements throughout.

Additionally, it will be understood that a "recess region" may refer to a hollow portion, e.g., a hole, an opening, a groove, and so forth, in a predetermined region of a layer. The recess region may have any suitable shape as determined by one of ordinary skill in the art, e.g., a cylinder, a square, a rectangle, a line, and so forth.

An exemplary embodiment of a method of forming a minute pattern of a semiconductor device according to the present invention will now be more fully described in conjunction with FIGS. 1-8.

First, as illustrated in FIG. 1, a material layer 130 may be formed on a semiconductor substrate 110 having a conductive region 125, followed by formation of a first mask layer 140 on the material layer 130. The first mask layer 140 and the material layer 130 may be formed of materials having an etch selectivity with respect to one another. In other words, when a certain etching gas or an etching solution is used, only one of the two layers, i.e., either the material layer 130 or the first mask layer 140, may be selectively etched. For example, the first mask layer 140 may be formed of titanium (Ti), titanium nitride (TiN), tantalum (Ta), tantalum nitride (TaN), and like materials. The material layer 130 may have a single-layer or a multi-layer structure, e.g. the material layer 130 may be similar to a resist layer 230, as will be discussed in more detail below with respect to FIGS. 14-18.

A photoresist pattern 150 having an island-type intaglio pattern 155 with a predetermined width d, as further illustrated in FIG. 1, may be formed on the first mask layer 140 by, e.g., a photolithography process. The width d of the intaglio pattern 155 may be formed by a flow of the photoresist during a heat treatment, e.g., a hard bake, to have a value of about 50 nm or less. Preferably, the width d of the intaglio pattern 155 may be about 10 nm to about 20 nm. The width d of the intaglio pattern 155 may be determined with respect to a desired width of an island type pattern to be formed in the material layer 130.

Figure 2:
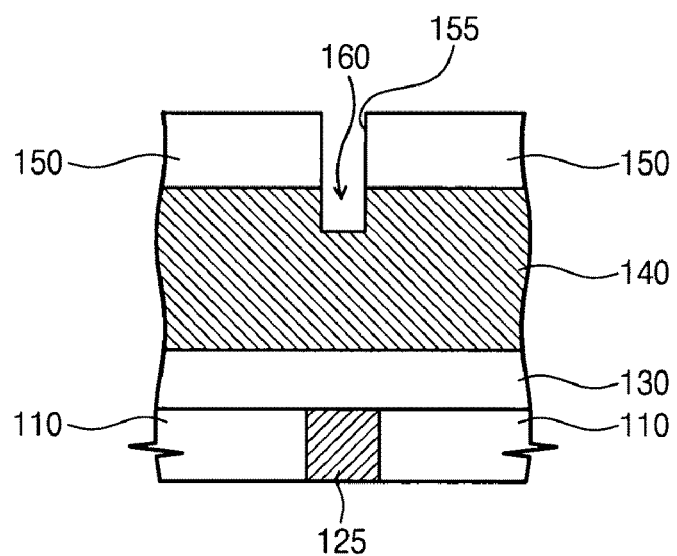
Figure 19:
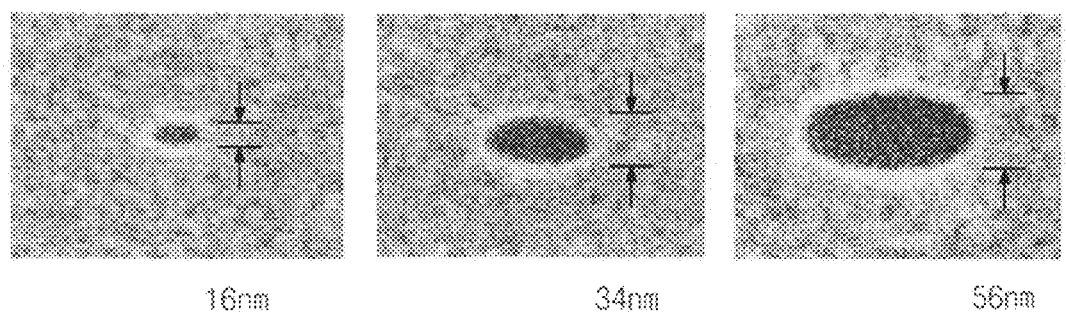
FIG. 19 illustrates a scanning electron microscope (SEM) photograph of a recess region formed in an upper portion of a mask layer according to an embodiment of the present invention.

Next, as illustrated in FIG. 2, the photoresist pattern 150 may be used as an etch mask to form a recess region 160 in an upper portion of the first mask layer 140 corresponding to the intaglio pattern 155 of the photoresist pattern. The recess region 160 may be formed by an etching process, e.g., anisotropic etching, to have a width of about 50 nm or less. In particular, the width d of the recess region 160 may be as narrow as about 56 nm, about 34 nm, and even about 16 nm, as illustrated by a SEM photograph in FIG. 19.

Figure 3:
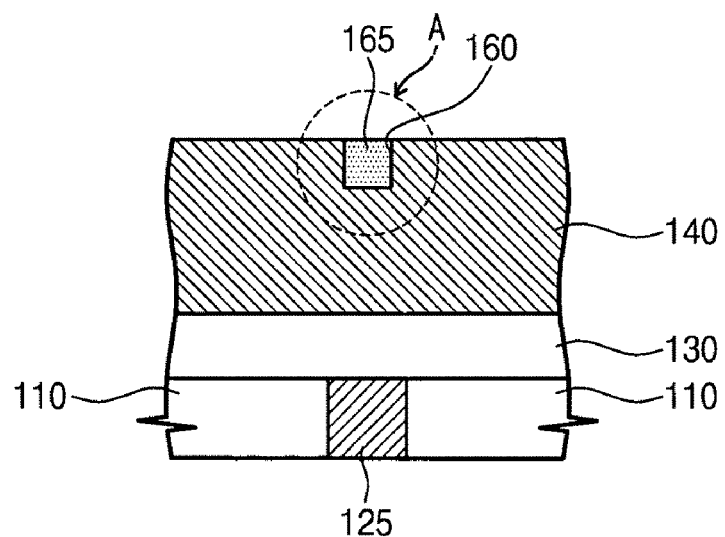

Subsequently, as illustrated in FIG. 3, the photoresist pattern 150 may be removed via an ashing process to form a first mask pattern 165 in the recess region 160 via a layer processing. The layer processing of the first mask pattern 165 may include formation of at least one sub-layer via layer deposition followed by etching thereof, and preferably a plurality of such layers, as will be described in more detail below with reference to FIGS. 4-6.

Figure 4:
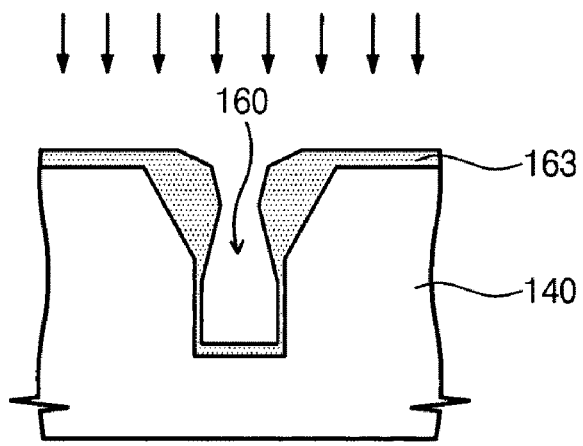

As illustrated in FIG. 4, a second mask layer 163 may be formed on the first mask layer 140. In particular, the second mask layer 163 may be deposited to a predetermined thickness onto an upper surface of the first mask layer 140 and onto inner surfaces, i.e. sidewalls and bottom surface, of the recess region 160 by any suitable method as determined by one of ordinary skill in the art, e.g., chemical vapor deposition (CVD), physical vapor deposition (PVD), atomic layer deposition (ALD), ion beam deposition (IBD), and so forth. The second mask layer 163 may be formed of any suitable material having an etch selectivity with respect to the first mask layer 140. For example, the second mask layer 163 may be formed of ruthenium (Ru), iridium (Ir), osmium (Os), palladium (Pd), platinum (Pt), copper (Cu), nickel iron (NiFe), aluminum oxide ($Al_2O_3$), silicon nitride (SiN), silicon oxide ($SiO_2$), and so forth.

Figure 5:
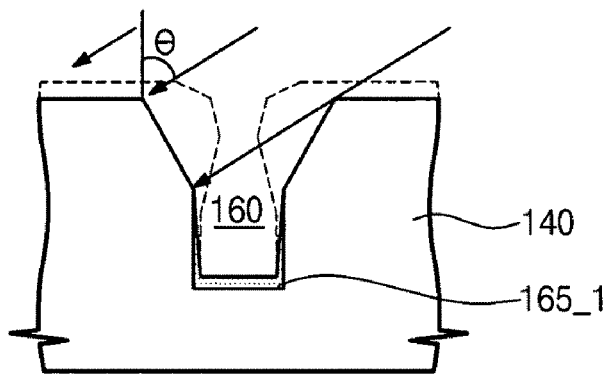
Figure 6:
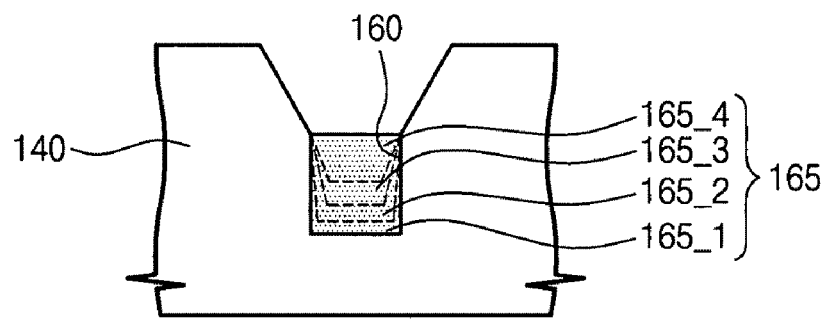

Next, as illustrated in FIGS. 5-6, a cycle of several etching steps may be performed on the second mask layer 163 to form the first mask layer pattern 165. For example, an ion beam may be directed toward the second mask layer 163 at an incidence angle θ, i.e., an angle as measured with respect to a normal to an upper surface of the first mask layer 140, larger than about 0° to perform etching thereof. The angle θ of the ion beam may be adjusted with respect to a thickness of the second mask layer 163, an aspect ratio of the recess region 160, and so forth, such that inner surfaces of the recess region 160 may remain substantially unetched. In other words, the ion beam may etch the second mask layer 163 in regions corresponding to an upper surface of the first mask layer 140 and in portions overhanging the recess region 160, as illustrated by the dashed line in FIG. 5. However, the ion beam may not reach a lower portion, e.g., the bottom surface, of the recess region 160. In this respect, it should be noted that uniform removal of the overhanging portions of the second mask layer 163 may be facilitated by rotating the semiconductor substrate 110 during the etching process.

The unetched portion of the second mask layer 163 on the bottom surface of the recess 160 may form a first sub-layer 165a, as illustrated in FIG. 5. Deposition of the second mask layer 163 onto the first mask layer 140 and etching thereof may be repeated several times in order to form additional sub-layers, e.g., second, third and fourth sub-layers 165b, 165c and 165d, respectively, as illustrated in FIG. 6, in order to form the first mask layer 165. The number of times that the second mask layer 163 is formed and etched, i.e., the number of sub-layers forming the first mask layer pattern 165, may be determined with respect to a desired thickness of the first mask pattern 165 to be formed, a height of the recess region 160, an etch selectivity between the first mask pattern 165 and the first mask layer 140, and so forth. For example, the layer processing may be repeated four times, i.e., the first mask layer pattern 165 may be formed of four sub-layers, i.e., first through fourth sub-layers 165a-165d, as further illustrated in FIG. 6. However, formation of the first mask layer pattern 165 of any other number of sub-layers is not excluded from the scope of the present invention.

The deposition and etching rates of the second mask layer 163 may vary. For example, as the layer formation process is repeated, the deposition rate may be increased. Therefore, a thickness of each deposited second mask layer 163 may be increased, i.e., the second sub-layer 165b may be thicker than the first sub-layer 165a, the third sub-layer 165c may be thicker than the second sub-layer 165b, and so forth. Similarly, as the layer processing is repeated, the etching rate may be increased by reducing an ion injection angle of the ion beam or increasing an intensity of the ion beam. Therefore, an etched portion of each second mask layer 163 may be increased, i.e., the second sub-layer 165b may be thinner than the first sub-layer 165a, the third sub-layer 165c may be thinner than the second sub-layer 165b, and so forth. Alternatively, a thickness of the sub-layers formed during the layer processing may be equal to one another, i.e., constant deposition and etching rates.

Figure 7:
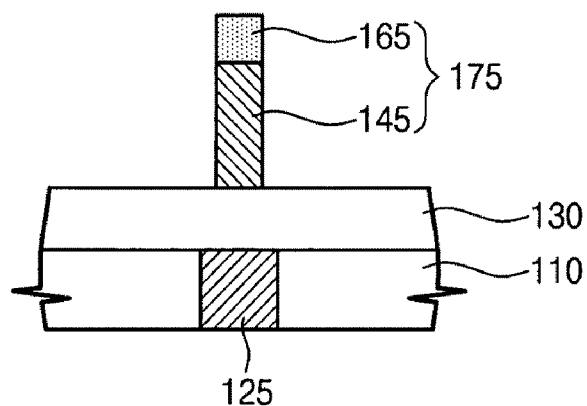

Once the first mask pattern 165 is formed, the first mask pattern 165 may be used as an etch mask to form a second mask pattern 145 under the first mask pattern 165, as illustrated in FIG. 7, by etching, e.g., anisotropic etching process. Selection of suitable materials with respect to etch selectivity of the first and second mask layer 163 and 140, as discussed previously, may provide formation of uniform first and second mask patterns 145 and 165. The first and second mask patterns 145 and 165 may be referred to as a mask pattern 175.

Figure 8:
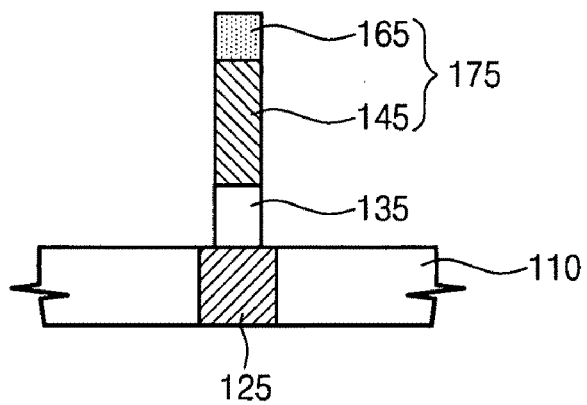

The mask pattern 175 may be used as an etch mask to pattern the material layer 130 into a material layer pattern 135 having an island-type pattern, as illustrated in FIG. 8, by an etching process, e.g., anisotropic etching.

The method according to an embodiment of the present invention as described above may be advantageous in providing a technique for etching a minute island-type pattern with a width of about 50 nm or less in a material layer.

Another exemplary embodiment of a method of forming a minute pattern of a semiconductor device according to the present invention is illustrated in FIGS. 9-13 and may be similar to the method described previously with respect to FIGS. 1-8, with the exception that a second mask pattern may not be formed.

Figure 9:
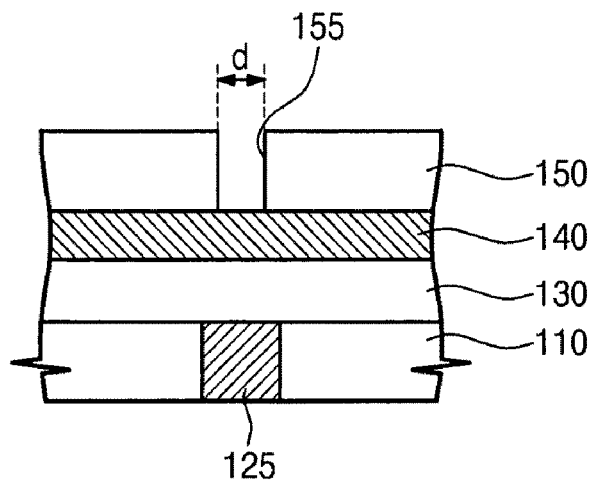
FIGS. 9-13 illustrate cross-sectional views of sequential steps during formation of a minute pattern in a semiconductor according to another embodiment of the present invention.

In particular, as illustrated in FIG. 9, a material layer 130 may be formed on a semiconductor substrate 110 having a conductive region 125, followed by formation of a first mask layer 140 on the material layer 130. The first mask layer 140 and the material layer 130 may be formed of materials having an etch selectivity with respect to each other.

A photoresist pattern 150 having an island-type intaglio pattern 155 with a predetermined width d, as further illustrated in FIG. 9, may be formed on the first mask layer 140 by, e.g., a photolithography process. The width d of the intaglio pattern 155 may be formed by a flow of the photoresist during a heat treatment, e.g., a hard bake, to have a value of about 50 nm or less. Preferably, the width d of the intaglio pattern 155 may be about 10 nm to about 20 nm. The width d of the intaglio pattern 155 may be determined with respect to a desired width of an island type pattern to be formed in the material layer 130.

Figure 10:
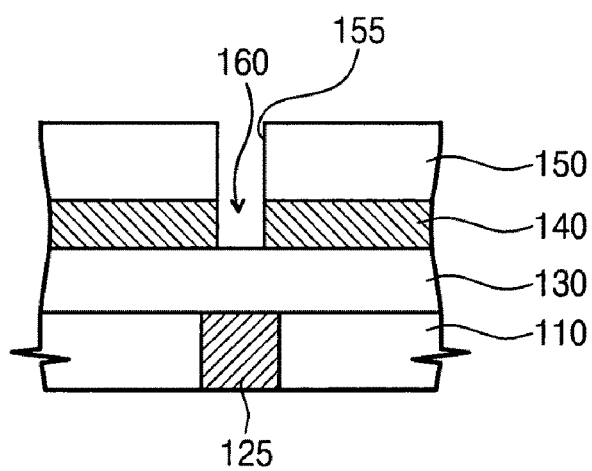

Next, as illustrated in FIG. 10, the photoresist pattern 150 may be used as an etch mask to form a recess region 160 in the first mask layer 140 corresponding to the intaglio pattern 155 of the photoresist pattern. The recess region 160 may be formed by an etching process, e.g., anisotropic etching, to have a width of about 50 nm or less. In contrast to the method described previously with respect to FIGS. 1-8, the recess region 160 may be formed through the first mask layer 140, such that an upper surface of the material layer 130 may be exposed.

In this respect it should be noted that since only one mask pattern, i.e., the first mask pattern 165, may be formed, the formed mask pattern may not depend on other mask formations and, therefore, may be formed in any suitable shape as determined by one of ordinary skill in the art with respect to material etch selectivity, thickness of the etched material layer, and so froth.

Figure 11:
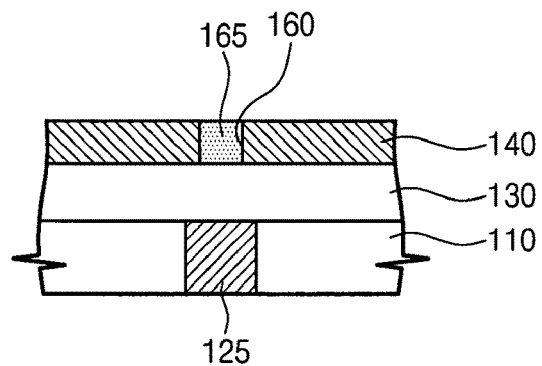

Subsequently, as illustrated in FIG. 11, the photoresist pattern 150 may be removed via an ashing process to form a first mask pattern 165 in the recess region 160 via a layer processing. The layer processing of the first mask pattern 165 may be similar to the layer formation described previously with respect to FIGS. 4-6, and therefore, will not be repeated herein.

Figure 12:
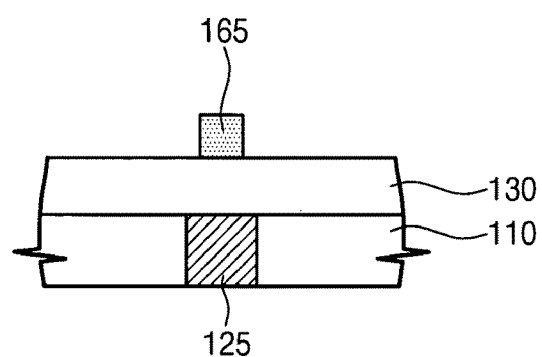
Figure 13:
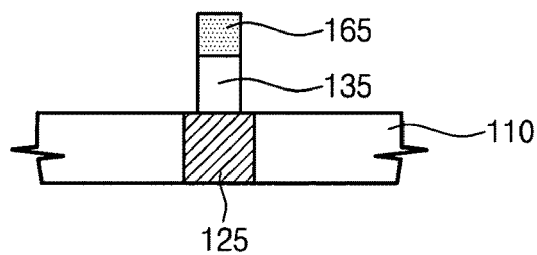

Once the first mask pattern 165 is formed, the first mask layer 140 may be removed to facilitate use of the first mask pattern 165 as an etch mask to etch the material layer 130 into a material layer pattern 135 having an island-type pattern, as illustrated in FIGS. 12-13. The etching may be performed by, e.g., anisotropic etching. The first mask layer 140 and the material layer 130 may be formed of materials having an etch selectivity with respect to the first mask pattern 165.

The method according to an embodiment of the present invention as described in FIGS. 9-13 may be advantageous in providing a technique for etching a minute island-type pattern with a width of about 50 nm or less in a material layer of a semiconductor device, thereby facilitating high integration of the semiconductor device.

Figure 20:
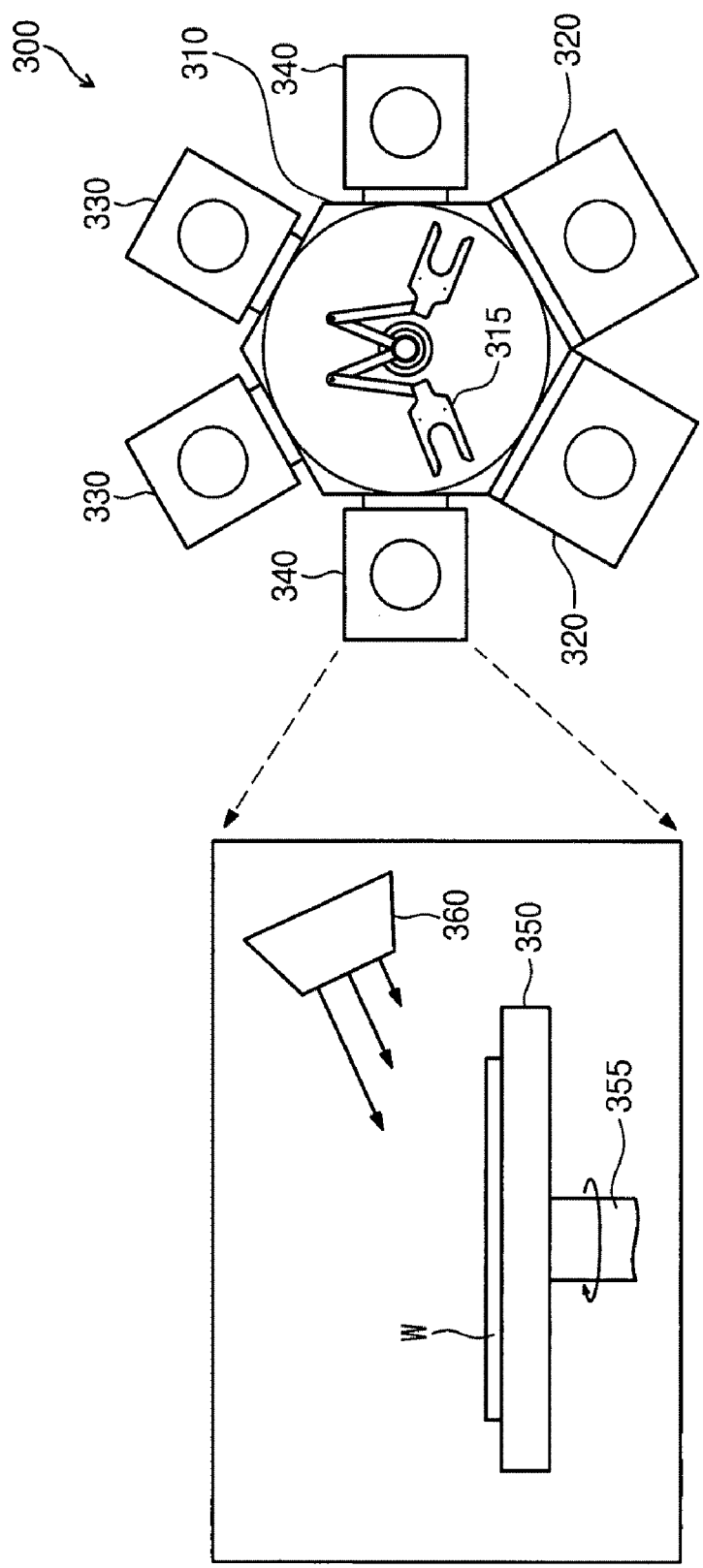
FIG. 20 illustrates a schematic view of a process system performing layer processing according to an embodiment of the present invention.

According to yet another embodiment of the present invention, illustrated in FIG. 20, a process system of the layer formation employed for forming the first mask pattern 165 may include a process system 300 with a multi-chamber structure. In detail, the process system 300 may include a transfer chamber 310, a loading/unloading chamber 320, a first process chamber 330, and a second process chamber 340.

The transfer chamber 310 may be located in a center of the process system 300 and include a wafer transfer unit 315, e.g., a transfer robot. The loading/unloading chamber 320 may provide a station for loading/unloading wafers. The first and second chambers 330 and 340 provide stations for performing layer deposition and etching, respectively.

The second process chamber may include a stage 350 for holding at least one wafer and an ion beam apparatus 360. The stage 350 may be supported by a supporting member 355 disposed thereunder. The supporting member 355 may rotate, thereby rotating the stage 350. Alternatively, the supporting member 355 may be fixed, so that the stage 350 may be rotated by an external power. The ion beam apparatus 360 may be positioned at a predetermined incident angle θ, an angle larger than 0°, with respect to the stage 350.

The process performed in the process system 300 is as follows. A wafer W may be loaded into the loading/unloading chamber 320 and transferred therefrom by the transfer unit 315 into the first process chamber 330, where layer deposition, i.e., a layer forming process, may be performed. Once the layer forming process is complete, the wafer W may be transferred into the second process chamber 340, i.e., placed on the stage 350 of the second process chamber 340, by the transfer unit 315 to begin an etching process.

When the wafer W is placed on the stage 350, the ion beam apparatus 360 may generate an ion beam directed toward the stage 350. Upon rotation of the stage 350, the ion beam of the ion beam apparatus 360 may etch portions of the layer deposited on the wafer W in the first process chamber 330. Due to the position of the ion beam apparatus 360, i.e., angled with respect to the wafer W, the ion beam may etch the wafer W at an angle θ.

Upon completion of etching, the wafer W may be transferred by the transfer unit 315 from the second process chamber 340 into the first process chamber 330 for deposition of additional layers. The wafer W may be transferred between the first and second process chambers 330 and 340 several times by the transfer unit 315 to form a mask pattern layer having a predetermined thickness. Once the predetermined thickness is achieved, the wafer W may be transferred by the transfer unit 315 into the loading/unloading chamber 310 to be unloaded.

According to still another embodiment, a method for forming a semiconductor memory device having a minute pattern will be described in detail below with respect to FIGS. 14-18. In this respect, it should be noted that the semiconductor memory device illustrated in FIGS. 14-18 will be referred to as a magnetic random access memory (MRAM). However, other types of semiconductor memory devices, e.g., a phase change RAM (PRAM), a resistance random access memory (RRAM), a ferroelectric RAM (FRAM), a dynamic RAM (DRAM), and so forth, are not excluded from the scope of the present invention.

Figure 14:
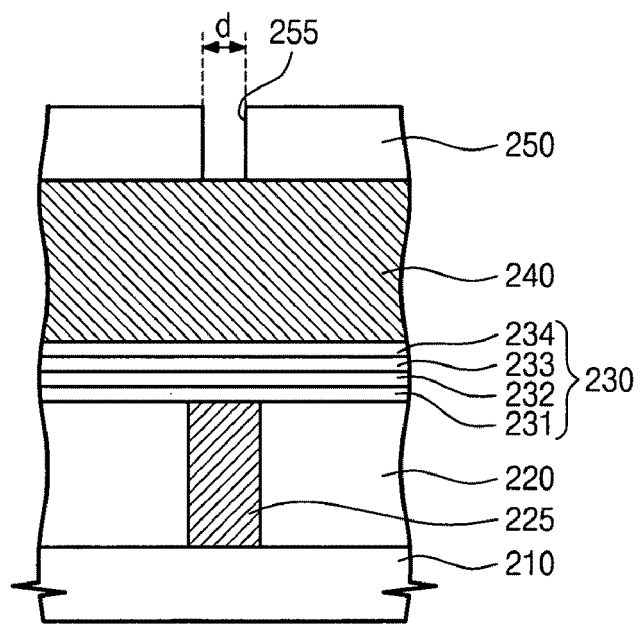
FIGS. 14-18 illustrate cross-sectional views of sequential steps during formation of a semiconductor memory device having a minute pattern according to an embodiment of the present invention.

Referring to FIG. 14, an interlayer insulating layer 220 having a conductive plug 225 may be formed by depositing an oxide layer on a semiconductor substrate 210 by any suitable method as determined by one of ordinary skill in the art. The conductive plug 225 of the interlayer insulating layer 220 may be formed through a patterning process, a conductive material deposition process, or a planarization process with respect to the interlayer insulating layer 220. Formation of the conductive plug 225 may include a general device isolation process, a transistor forming process, or any other suitable process as determine by one of ordinary skill in the art. For example, the conductive plug 225 may be electrically connected to an impurity region, i.e., a source/drain region, of a transistor.

A resist layer 230 may be formed on the interlayer insulating layer 220 by sequentially depositing an antiferromagnetic layer 231, a first ferromagnetic layer 232, an insulating layer 233, and a second ferromagnetic layer 234 on the interlayer insulating layer 200. The antiferromagnetic layer 231 may be formed of iridium manganese (IrMn), platinum manganese (PtMn), manganese oxide (MnO), iron oxide (FeO), cobalt chloride ($CoCl_2$), nickel chloride ($NiCl_2$), nickel oxide (NiO), chromium (Cr), or like materials. The first and second ferromagnetic layers 232 and 234 may be formed of iron (Fe), cobalt (Co), nickel (Ni), manganese antimonide (MnSb), chromium oxide ($CrO_2$), or like materials. The insulating layer 233 may be formed of aluminum oxide ($Al_2O_3$), manganese oxide (MgO), or like materials. The resist layer 230 may be used as a data storage layer in the semiconductor memory device. i.e., MRAM. The PRAM, RRAM and FRAM may include a phase change material layer, a transition metal oxide layer, and a ferroelectric layer, respectively, as a data storage layer.

A first mask layer 240 may be formed on the resist layer 230. The first mask layer 240 and the resist layer 230 may be formed of materials having an etch selectivity with respect to each other.

A photoresist pattern 250 having an island type intaglio pattern 255 with a width d of about 50 nm or less may be formed on the mask layer 240 by, e.g., a photolithography process. The width d of the intaglio pattern 255 may be formed by a flow of the photoresist during a heat treatment, e.g., a hard bake, to have a value of about 50 nm or less.

Next, as illustrated in FIG. 14, the photoresist pattern 250 may be used as an etch mask to form a recess region 260 in an upper portion of the first mask layer 240 via etching. The recess region 260 may be formed to have a width of about 50 nm or less.

Figure 15:
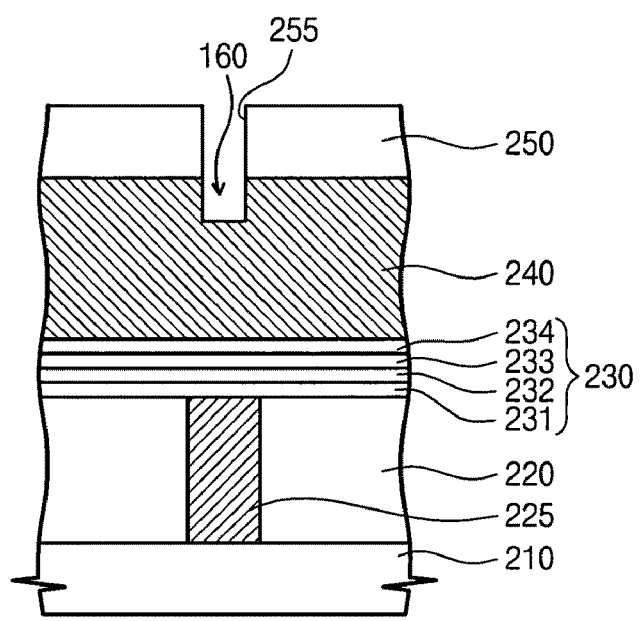
Figure 16:
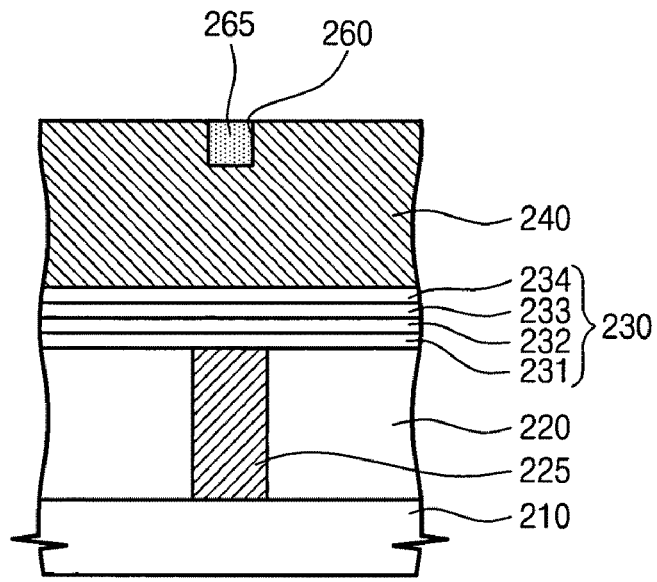
Figure 17:
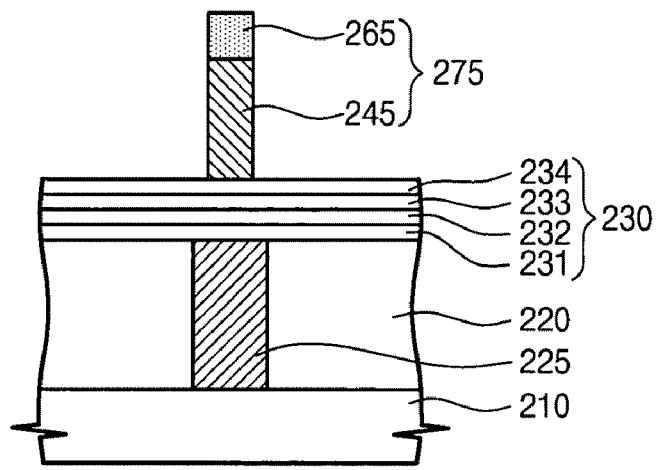
Figure 18:
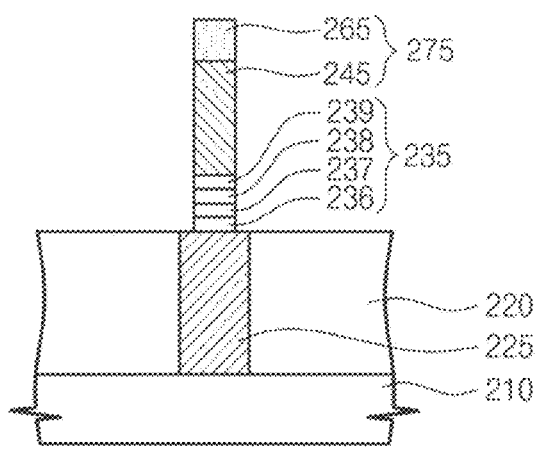

Once the recess region 160 is formed, as illustrated in FIGS. 15-16, an ashing process may be performed to remove the photoresist pattern 250 and to form a first mask pattern 265 in the recess region 260 via a layer processing. The layer processing of the first mask pattern 265 may be similar to the layer formation described previously with respect to FIGS. 4-6, and therefore, will not be repeated herein.

Once the first mask pattern 265 is formed, the first mask pattern 265 may be used as an etch mask to etch the first mask layer 240 and form a second mask pattern 245, such that the first and second mask patterns 265 and 245 may form a mask pattern 275. Detailed descriptions of formation of the mask pattern 275 and the first and second mask patterns 265 and 245 are similar to the formation of the mask pattern 75 and the first and second mask patterns 65 and 45 described previously with respect to FIGS. 1-8 and, therefore, will not be repeated herein.

Once the mask pattern 275 is complete, an etching process, e.g., anisotropic etching, may be performed using the mask pattern 275 as an etch mask to form a resist layer pattern 235. The resist layer pattern 235 may include an antiferromagnetic layer pattern 236, a first ferromagnetic layer pattern 237, an insulating layer pattern 238, and a second ferromagnetic layer pattern 239. In order to uniformly form the resist layer pattern 235, the resist layer 230 may be formed of a material having an etch selectivity with respect to the mask pattern 275.

The antiferromagnetic layer pattern 236, the first ferromagnetic layer pattern 237, and the second ferromagnetic layer pattern 239 may be called a pinned layer, a fixed layer, and a free layer, respectively. A magnetization direction of the fixed layer 237 may be fixed by the pinned layer 236 to provide no change in the direction during a general read/program operation of the memory device. On the other hand, a magnetization direction of the free layer 239 may be changed, i.e., the magnetization direction of the free layer 239 may be similar or opposite to the magnetization direction of the fixed layer 237.

The conventional MRAM may include a digit line between the resist layer pattern, e.g., a memory cell, and the conductive plug to record data in the resist layer pattern via magnetization, i.e., currents may be applied to a bit line and to a digit line positioned in communication with a resist layer pattern, thereby forming magnetic fields to facilitate selection of a predetermined resist layer pattern via magnetization. However, use of the digit line may limit high integration of the MRAM and affect the magnetization direction of the unselected resist layer pattern.

In contrast, a spin torque transfer (STT) MRAM formed according to an embodiment of the present invention may include a resist layer in direct communication with the conductive plug, so that the conductive plug may function as a lower electrode and the mask pattern may function as an upper electrode, i.e., the first and second mask patterns may be formed of a conductive material. Alternatively, a separate lower electrode may be formed between the conductive plug and the resist layer. Accordingly, current application and magnetization of the resist layer may be improved, thereby facilitating formation of a resist layer pattern having a width of about 50 nm or less and improving the reliability and operation characteristic of the STT MRAM. A resist layer pattern having a width of about 50 nm may be formed with a general exposure equipment.

The method according to an embodiment of the present invention, as described in FIGS. 14-18, may be advantageous in providing a technique for forming a resist layer pattern having a minute island-type pattern with a width of about 50 nm or less in a semiconductor memory device, thereby facilitating high integration thereof. The resist layer pattern may further be formed to a width of about 10 nm to about 20 nm.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for forming a minute pattern on a semiconductor substrate, the method comprising:
    depositing a material layer on the semiconductor substrate having a conductive region;
    forming a first mask layer on the material layer;
    forming a recess region and an upper region in the first mask layer;
    performing layer processing to form a first metal mask pattern in the recess region, the upper region being above the first metal mask pattern; and
    etching the material layer using the first metal mask pattern as an etch mask to form a material layer pattern of the minute pattern after removing at least the upper region of the first mask layer, the first metal mask pattern forming an upper electrode and the conductive region forming an underlying lower electrode of the minute pattern, wherein:
        forming the first metal mask pattern includes forming a plurality of sub mask-layer-patterns, each sub mask-layer pattern being formed by alternating formation of a sub mask-layer and etching a portion of the sub mask-layer,
        formation of each sub mask-layer includes at least forming the sub mask-layer along inner surfaces of the upper region and the recess region, and
        etching each sub mask-layer includes etching the inner surfaces of the upper region, and the inner surfaces of the recess region remain substantially unetched.

2. The method as claimed in claim 1, wherein forming the recess region and the upper region in the first mask layer includes:
    forming a photoresist pattern with an intaglio pattern on the first mask layer;
    etching the first mask layer; and
    removing the photoresist pattern.

3. The method as claimed in claim 1, wherein performing the layer processing includes sequentially forming the plurality of sub mask-layer patterns.

4. The method as claimed in claim 3, wherein etching of the sub mask-layer pattern includes using an ion beam to etch at least the upper region in the first mask layer by projecting an ion beam apparatus at an incidence angle larger than 0° toward the upper region in the first mask layer.

5. The method as claimed in claim 4, wherein adjusting the ion beam apparatus includes continuous adjusting of the incidence angle.

6. The method as claimed in claim 4, wherein using the ion beam includes rotating the semiconductor substrate.

7. The method as claimed in claim 3, wherein forming the plurality of sub mask-layer patterns includes subsequently forming each corresponding sub mask-layer at an increasing deposition rate, such that the sub mask-layer patterns in the first metal mask pattern have an increasing thickness.

8. The method as claimed in claim 3, wherein etching the plurality of sub mask-layer patterns includes subsequenty etching each sub mask-layer pattern at an increasing etching rate.

9. The method as claimed in claim 3, wherein performing layer processing includes constant deposition and etching rates for the plurality of sub mask-layer patterns.

10. The method as claimed in claim 1, wherein forming the first mask layer includes employing a material having an etch selectivity with respect to a material used to form the first metal mask pattern, the first mask layer and the first metal mask pattern being formed of different conductive materials.

11. The method as claimed in claim 10, wherein employing a material having an etch selectivity with respect to a material used to form the first metal mask pattern includes forming the first mask layer of titanium (Ti), titanium nitride (TiN), tantalum (Ta), or tantalum nitride (TaN), and forming the first metal mask pattern of ruthenium (Ru), iridium (Ir), osmium (Os), palladium (Pd), platinum (Pt), copper (Cu), nickel iron (NiFe), aluminum oxide ($Al_2O_3$), or silicon nitride (SiN).

12. The method as claimed in claim 1, wherein etching the material layer includes etching a lower portion of the first mask layer to form a second mask pattern under the first metal mask pattern and above the material layer pattern.

13. The method as claimed in claim 1, wherein depositing the material layer includes depositing a material having an etch selectivity with respect to a material of the first mask layer.

14. A method for forming a semiconductor memory device including a minute pattern for data storage on a semiconductor substrate, the method comprising:
    forming an interlayer insulating layer with a conductive plug on the semiconductor substrate;
    forming a data storage layer on the interlayer insulating layer;
    forming a first mask layer on the data storage layer;
    forming a recess region and an upper region in the first mask layer;
    performing layer processing to form a first metal mask pattern in the recess region, the upper region being above the first metal mask pattern; and
    etching the material layer using the first metal mask pattern as an etch mask to form a data storage layer pattern of the minute pattern after removing at least the upper region of the first mask layer, the first metal mask pattern forming an upper electrode and the conductive plug forming an underlying lower electrode of the minute pattern, wherein:
    forming the first metal mask pattern includes forming a plurality of sub mask-layer-patterns, each sub mask-layer pattern being formed by alternating formation of a sub mask-layer and etching a portion of the sub mask-layer,
    formation of each sub mask-layer includes at least forming the sub mask-layer along inner surfaces of the upper region and the recess region, and
    etching each sub mask-layer includes etching the inner surfaces of the upper region, and the inner surfaces of the recess region remain substantially unetched.

15. The method as claimed in claim 14, wherein forming the data storage layer includes forming a resist layer.

16. The method as claimed in claim 15, wherein forming the resist layer includes forming an antiferromagnetic layer, a ferromagnetic layer, an insulating layer, and a ferromagnetic layer.

17. The method as claimed in claim 15, wherein forming the resist layer includes forming a phase change material layer or a transition metal oxide layer.

18. The method as claimed in claim 14, wherein forming the data storage layer includes forming a ferroelectric layer.

19. The method as claimed in claim 14, wherein forming the recess region and the upper region in the first mask layer includes:
    forming a photoresist pattern with an intaglio pattern on the first mask layer;
    etching the first mask layer; and
    removing the photoresist pattern.

20. The method as claimed in claim 14, wherein etching of the sub mask-layer includes using an ion beam and rotating the semiconductor substrate, the ion beam being projected from an ion beam apparatus at an incidence angle greater than 0° toward the upper region in the first mask layer.

21. The method as claimed in claim 20, adjusting the ion beam apparatus includes continuous adjusting of the incidence angle.

22. The method as claimed in claim 14, wherein:
    forming the layer processing includes sequentially forming the plurality of sub mask-layer patterns, and
    forming the plurality of sub mask-layer patterns includes subsequently forming each sub mask-layer at an increasing deposition rate, such that the sub mask-layer patterns in the first metal mask pattern have an increasing thickness.

23. The method as claimed in claim 14, wherein:
    forming the layer processing includes sequentially forming the plurality of sub mask-layer patterns, and
    etching the plurality of sub mask-layer patterns includes etching each sub mask-layer pattern at an increasing etching rate.

24. The method as claimed in claim 14, wherein:
    forming the layer processing includes sequentially forming the plurality of sub mask-layer patterns, and
    the sub mask-layer patterns are formed at constant deposition and etching rates.

25. The method as claimed in claim 14, wherein forming the first mask layer includes employing a material having an etch selectivity with respect to a material used to form the first metal mask pattern, the first mask layer and the first metal mask pattern being formed of different conductive materials.

26. The method as claimed in claim 25, wherein employing a material having an etch selectivity with respect to a material used to form the first metal mask pattern includes forming the first mask layer of titanium (Ti), titanium nitride (TiN), tantalum (Ta), or tantalum nitride (TaN), and forming the first metal mask pattern of ruthenium (Ru), iridium (Ir), osmium (Os), palladium (Pd), platinum (Pt), copper (Cu), nickel iron (NiFe), aluminum oxide ($Al_2O_3$), or silicon nitride (SiN).

27. The method as claimed in claim 14, wherein depositing the data storage layer includes depositing a material having an etch selectivity with respect to the material of the first mask layer.

28. The method as claimed in claim 3, wherein after etching each sub mask-layer the upper region exposes the sub mask-layer pattern.

29. The method as claimed in claim 3, wherein a width of an upper portion of the upper region is greater than a width of an upper portion of the recess region.

30. The method as claimed in claim 14, wherein after etching each sub mask-layer the upper region exposes the sub mask-layer pattern.

31. The method as claimed in claim 14, wherein a width of an upper portion of the upper region is greater than a width of an upper portion of the recess region.

32. The method as claimed in claim 14, further comprising forming a second mask pattern under the first mask pattern by removing the upper region of the first mask pattern and portions of the first metal mask pattern adjacent to the first mask layer, the first metal mask pattern and the second mask pattern forming the upper electrode in the minute pattern.

33. The method as claimed in claim 1, further comprising forming a second mask pattern under the first metal mask pattern by removing the upper region of the first mask pattern and portions of the first metal mask pattern adjacent to the first mask layer, the first metal mask pattern and the second mask pattern forming the upper electrode in the minute pattern.

* * * * *